United States Patent
Lo et al.

(10) Patent No.: US 12,402,433 B2
(45) Date of Patent: Aug. 26, 2025

(54) OPTOELECTRONIC DEVICE INCLUDING LATERALLY DISPOSED DRIVING ELECTRODE

(71) Applicant: National Tsing Hua University, Hsinchu (TW)

(72) Inventors: Cheng-Yao Lo, Hsinchu (TW); Padmanabh Pundrikaksha Pancham, Hsinchu (TW); Yu-Xin Zeng, Hsinchu (TW); Chih-Liang Pan, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 18/302,157

(22) Filed: Apr. 18, 2023

(65) Prior Publication Data

US 2024/0105865 A1 Mar. 28, 2024

(30) Foreign Application Priority Data

Sep. 23, 2022 (TW) .................................. 111136090

(51) Int. Cl.
*H10H 20/81* (2025.01)
*H10F 77/00* (2025.01)
(Continued)

(52) U.S. Cl.
CPC ......... *H10F 77/211* (2025.01); *H10F 77/935* (2025.01); *H10H 20/812* (2025.01); *H10H 20/8314* (2025.01)

(58) Field of Classification Search
CPC ....... H01L 33/06; H01L 33/385; H01L 33/44; H01L 31/022425; H01L 31/02008;
(Continued)

(56) References Cited

U.S. PATENT DOCUMENTS 6,281,524 B1 * 8/2001 Yamamoto .............. H01L 24/06
257/99
7,847,298 B2 * 12/2010 Ogihara .............. H01L 33/0093
257/E33.068
(Continued)

FOREIGN PATENT DOCUMENTS

CN 102569585 A * 7/2012 ............. H01L 33/38
CN 102569586 A * 7/2012 ............. H01L 33/38
(Continued)

OTHER PUBLICATIONS

Taiwanese Search Report for Taiwanese Application No. 111136090, dated Jul. 17, 2023, with an English translation.

*Primary Examiner* — Ida M Soward
(74) *Attorney, Agent, or Firm* — Birch, Stewart, Kolasch & Birch, LLP

(57) ABSTRACT

An optoelectronic device includes a first electrode, a second electrode that is spaced apart from the first electrode, an optoelectronic unit that is disposed between the first electrode and the second electrode, an insulating layer and a driving electrode. The optoelectronic unit includes an optoelectronic stack emitting or absorbing at least two wavelengths of light. The insulating layer is disposed on a lateral side of the optoelectronic stack that extends in a stacking direction of the optoelectronic stack. The driving electrode is disposed on the insulating layer at a location corresponding in position to the optoelectronic unit and is separated from the first and second electrodes.

4 Claims, 8 Drawing Sheets

(51) Int. Cl.
*H10F 77/20* (2025.01)
*H10H 20/812* (2025.01)
*H10H 20/831* (2025.01)

(58) Field of Classification Search
CPC . H01L 31/1013; H10F 30/288; H10H 20/812; H10H 20/8314; H10H 20/84
See application file for complete search history.

(56) References Cited

U.S. PATENT DOCUMENTS

| | | | |
|---|---|---|---|
| 8,163,581 B1 | 4/2012 | Or-Bach et al. | |
| 2004/0184498 A1* | 9/2004 | Ueki | H01S 5/18341 372/46.013 |
| 2006/0081857 A1* | 4/2006 | Hong | H10H 29/10 257/E27.12 |
| 2006/0208265 A1* | 9/2006 | Yukimoto | B41J 2/45 257/88 |
| 2007/0252156 A1* | 11/2007 | Ogihara | B41J 2/45 257/79 |
| 2010/0078656 A1* | 4/2010 | Seo | H01L 33/22 257/E33.056 |
| 2013/0234105 A1* | 9/2013 | Chang | H10H 20/84 438/22 |
| 2013/0264603 A1* | 10/2013 | Lin | H01L 33/385 257/99 |
| 2014/0131657 A1* | 5/2014 | Kim | H10H 20/831 257/13 |
| 2014/0239318 A1* | 8/2014 | Oyu | H10H 20/857 257/98 |
| 2015/0263242 A1* | 9/2015 | Tomizawa | H10H 20/854 257/98 |
| 2015/0280089 A1* | 10/2015 | Obata | H10H 20/857 257/98 |
| 2016/0204305 A1* | 7/2016 | Chiu | H10H 20/811 257/94 |
| 2020/0295229 A1* | 9/2020 | Kim | H10H 20/814 |
| 2022/0093825 A1* | 3/2022 | Cha | H10H 20/835 |
| 2022/0158033 A1* | 5/2022 | Nishiyama | H10H 20/857 |

FOREIGN PATENT DOCUMENTS

| | | | | |
|---|---|---|---|---|
| CN | 113169259 A | * | 7/2021 | .......... H10H 20/841 |
| CN | 114203867 A | | 3/2022 | |
| KR | 100609968 B1 | * | 8/2006 | ............ H10H 29/10 |
| TW | 202226633 A | | 7/2022 | |
| WO | WO-2016115877 A1 | * | 7/2016 | ............ H01L 33/38 |

\* cited by examiner

OPTOELECTRONIC DEVICE INCLUDING LATERALLY DISPOSED DRIVING ELECTRODE

CROSS-REFERENCE TO RELATED APPLICATION

This application claims priority to Taiwanese Invention Patent Application No. 111136090, filed on Sep. 23, 2022.

FIELD

The disclosure relates to an optoelectronic device, and more particularly to a color adjustable light emitting device and a solar cell.

BACKGROUND

In a light emitting diode (LED), the color of a light emitted from the LED is determined by the band gap of the semiconductor used in the LED. Generally, a conventional LED only emits one color of light (i.e., a color-specific LED) and the color of the LED may not be adjusted. When a desired or predetermined color of light cannot be obtained from one LED, a plurality of color-specific LEDs have to be used to mix the colors of light emitted therefrom to produce the desired or predetermined color of light. This increases operational difficulties and lacks operational flexibility.

SUMMARY

Therefore, an object of the disclosure is to provide an optoelectronic device that can alleviate at least one of the drawbacks of the prior art.

According to the disclosure, the optoelectronic device includes a first electrode, a second electrode that is spaced apart from the first electrode, an optoelectronic unit that is disposed between the first electrode and the second electrode, an insulating layer and a driving electrode. The optoelectronic unit includes an optoelectronic stack emitting or absorbing at least two wavelengths of light. The insulating layer is disposed on a lateral side of the optoelectronic stack that extends in a stacking direction of the optoelectronic stack. The driving electrode is disposed on the insulating layer at a location corresponding in position to the optoelectronic unit and is separated from the first and second electrodes.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
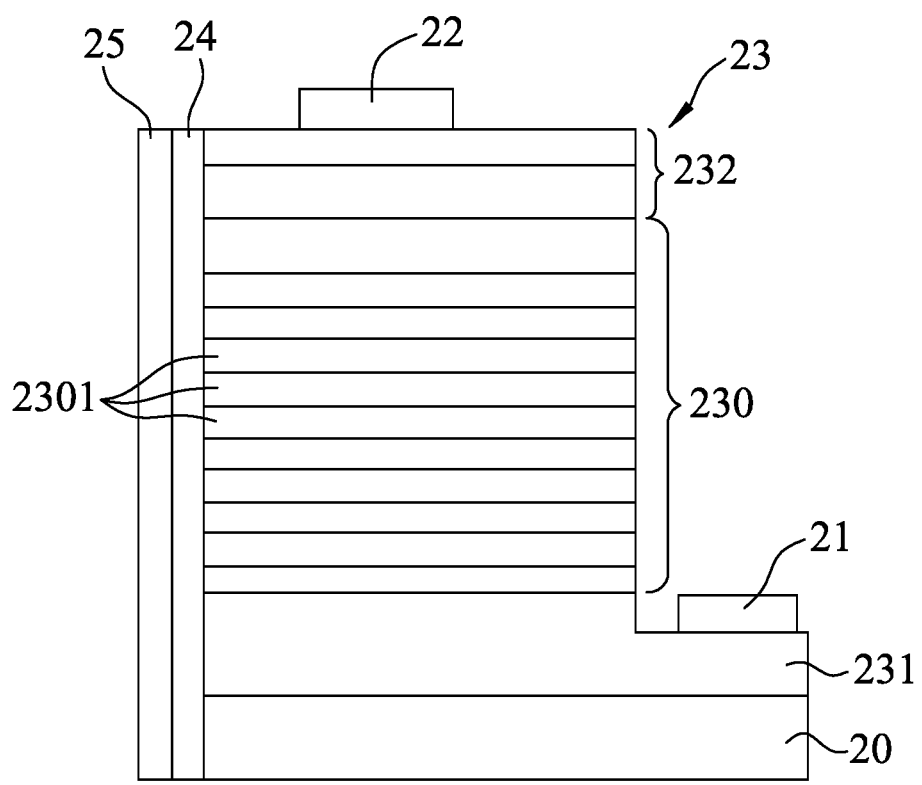
FIG. 1 is a cross-sectional view illustrating a first embodiment of an optoelectronic device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of an optoelectronic device according to the disclosure includes a first electrode 21, a second electrode 22 that is spaced apart from the first electrode 21, an optoelectronic unit 23 that is disposed between the first electrode 21 and the second electrode 22, an insulating layer 24 and a driving electrode 25. The optoelectronic unit 23 includes an optoelectronic stack 230 capable of emitting at least two wavelengths of light. The insulating layer 24 is disposed on and covers a lateral side of the optoelectronic stack 230 that extends in a stacking direction of the optoelectronic stack 230. The driving electrode 25 is disposed on the insulating layer 24 at a location corresponding in position to the optoelectronic unit 23 and is separated from the first and second electrodes 21, 22.

In this embodiment, the optoelectronic device is an inorganic light emitting device and may be a color adjustable light emitting device, and the optoelectronic stack 230 is a light emitting stack. The optoelectronic device further includes a substrate 20, and the optoelectronic unit 23 further includes a first-type epitaxial layer 231 and a second-type epitaxial layer 232.

To be specific, the first-type epitaxial layer 231 is disposed on the substrate 20, and the optoelectronic stack 230 is disposed between the first-type epitaxial layer 231 and the second-type epitaxial layer 232. The first electrode 21 is disposed on and contacts the first-type epitaxial layer 231, and the second electrode 22 is disposed on and contacts the second-type epitaxial layer 232.

In this embodiment, a portion of the first-type epitaxial layer 231 opposite to the substrate 20 is exposed, and the first electrode 21 is directly disposed on the exposed portion of the first-type epitaxial layer 231. The insulating layer 24 covers a lateral side of the first-type epitaxial layer 231, a lateral side of the optoelectronic stack 230 and a lateral side of the second-type epitaxial layer 232 that are opposite to the first electrode 21, and the driving electrode 25 completely covers the insulating layer 24.

It should be noted that the first-type semiconductor layer 231 is one of a p-type semiconductor layer and an n-type semiconductor layer, and the second-type semiconductor layer 232 is the other one of a p-type semiconductor layer and an n-type semiconductor layer. In this embodiment, the first-type semiconductor layer 231 is an n-type semiconductor layer and the second-type semiconductor layer 232 is a p-type semiconductor layer. The optoelectronic stack 230 is formed in a multiple quantum well (MQW) structure and includes a plurality of stack units 2301 each of which is constituted of an $In_xGa_{1-x}N$ film layer and a GaN film layer.

For example, the optoelectronic stack 230 includes eleven stack units 2301, i.e., twenty two film layers. To be specific, the eleven stack units 2301 include two stack units of $In_{0.2}Ga_{0.8}N/GaN$ (four film layers), two stack units of $In_{0.23}Ga_{0.77}N/GaN$, two stack units of $In_{0.26}Ga_{0.74}N/GaN$ (four film layers), one stack unit of $In_{0.3}Ga_{0.7}N/GaN$ (two film layers), one stack unit of $In_{0.33}Ga_{0.67}N/GaN$ (two film layers), one stack unit of $In_{0.35}Ga_{0.65}N/GaN$ (two film layers), one stack unit of $In_{0.4}Ga_{0.6}N/GaN$ (two film layers) and one stack unit of $In_{0.5}Ga_{0.5}N/GaN$ (two film layers), all of which are stacked sequentially one on another on the first-type semiconductor layer 231 in such an order. The colors of lights emitted from the stack units 2301 may be adjusted by changing the amounts of In and Ga in the stack units 2301 during the epitaxial process so that the optoelectronic stack 230 can produce a reddish light, a greenish light and a bluish light. It should be noted that the materials of each of the stack unit 2301 are not limited to $In_xGa_{1-x}N$ and GaN, and the number of the stack units are not limited.

In this embodiment, the first-type semiconductor layer 231 is made of n-GaN, and the second-type semiconductor layer 232 is a two-layer structure that includes, but not limited to, a layer of $p-Al_{0.1}Ga_{0.9}N$ formed on the optoelectronic unit 230 and a layer of p-GaN formed on the $p-Al_{0.1}Ga_{0.9}N$ layer.

Figure 2:
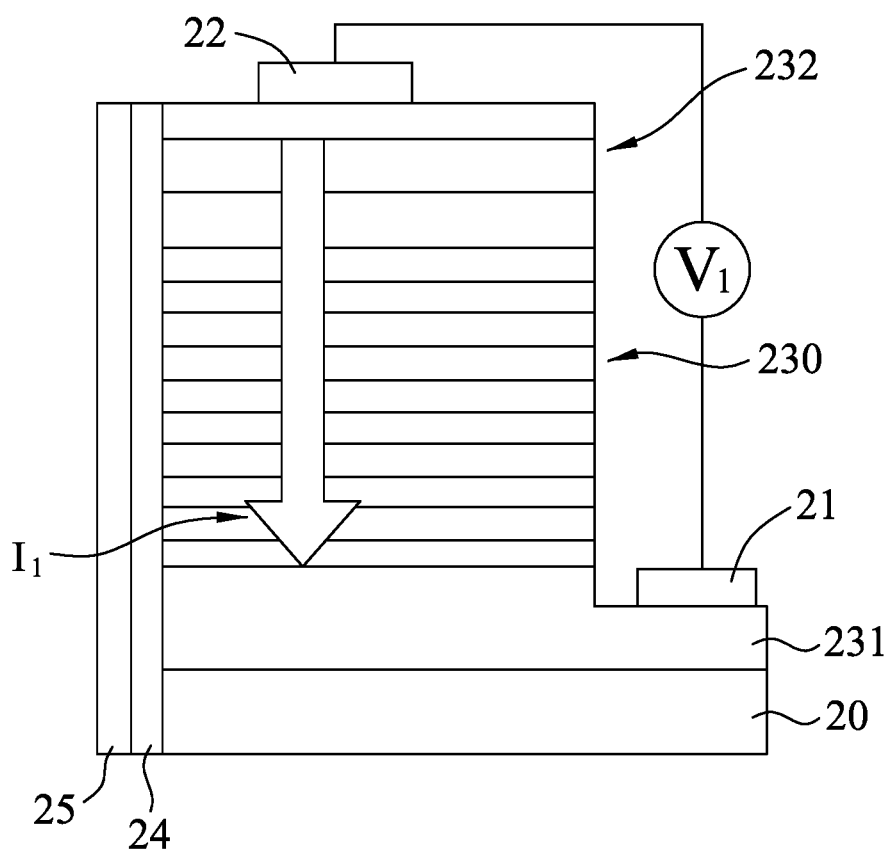
FIG. 2 is a cross-sectional view illustrating a first voltage applying unit used in the first embodiment.
Figure 3:
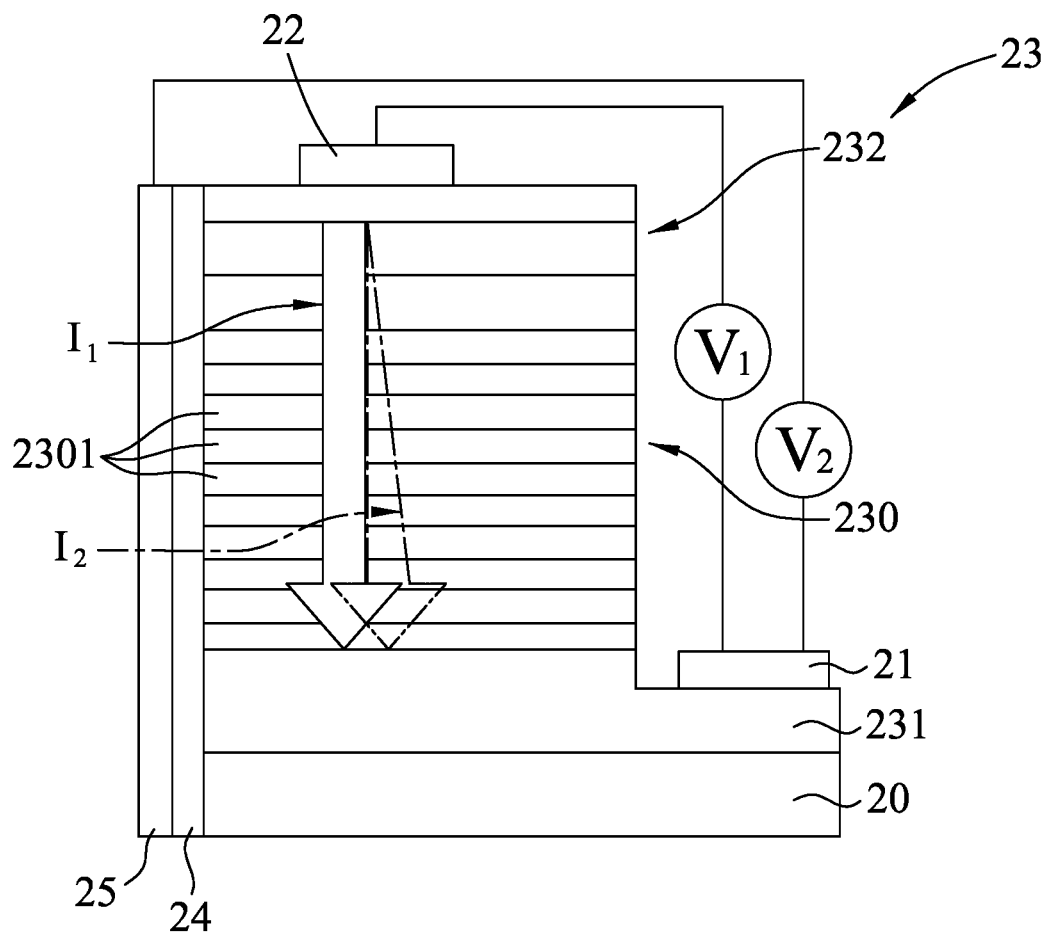
FIG. 3 is a cross-sectional view illustrating first and second voltage applying units used in the first embodiment.

Referring to FIGS. 2 and 3, the first electrode 21 functions as a cathode, and the second electrode 22 functions as an anode. The optoelectronic device further includes a first voltage applying unit ($V_1$) that is adapted to apply a first voltage and generate a first electric field between the first and second electrodes 21, 22 (see FIGS. 2 and 3), and a second voltage applying unit ($V_2$) that is adapted to apply a second voltage and generate a second electric field between the first electrode 21 and the driving electrode 25 (see FIG. 3). The first voltage produces a first current ($I_1$) passing through the optoelectronic unit 23, i.e., the second-type epitaxial layer 232, the optoelectronic stack 230 and the first-type epitaxial layer 231. The second voltage produces a second current ($I_2$) that is different from the first current ($I_1$). The flow directions of the first current ($I_1$) and the second current ($I_2$) are influenced by relative positions of the first electrode 21, the second electrode 22 and the driving electrode 25 and may be different from each other.

Referring to FIG. 2, when the first voltage is applied between the first and second electrodes 21, 22, an overall current is contributed only by the first current ($I_1$) and is uniformly distributed over the optoelectronic stack 230 between the first and second electrodes 21, 22. Therefore, the optoelectronic stack 230 has a uniform current density. Referring to FIG. 3, when the second voltage is additionally applied between the first electrode 21 and the driving electrode 25, the overall current is contributed by the first current ($I_1$) and the second current ($I_2$) and is not uniformly distributed over the optoelectronic stack 230 between the first and second electrodes 21, 22. Therefore, the optoelectronic stack 230 has a non-uniform current density. To be specific, an upper portion of the optoelectronic stack 230 adjacent to the second-type epitaxial layer 232 has a current density greater than that of a lower portion of the optoelectronic stack 230 adjacent to the first-type epitaxial layer 231.

The optoelectronic stack 230 can emit different wavelengths of light because the multiple stack units 2301 of the optoelectronic stack 230 can respectively emit different wavelengths of light (i.e., different light colors). As the driven electrode 25 cooperates with the first and second electrodes 21, 22, the overall current flowing through the optoelectronic stack 230 is changeable by controlling the first and second currents ($I_1$, $I_2$). In this embodiment, the second voltage applying unit ($V_2$) is controllable to adjust the second current ($I_2$) relative to the first current ($I_1$), as well as adjust a current density difference occurring in the optoelectronic stack 230. Thus, the overall current distribution in the optoelectronic stack 230 may be controlled and the wavelengths of light emitted by the optoelectronic stack 230 may be adjusted.

In FIG. 2, the optoelectronic stack 230 can emit a red light, a green light and a blue light when the first voltage applying unit ($V_1$) applies the first voltage between the first and second electrodes 21, 22 to create the first current ($I_1$). The overall color of light emitted from the optoelectronic device is a mixture of the colors of lights emitted from the stack units 2301 of the optoelectronic stack 230. However, the overall color of light emitted from the optoelectronic stack 230 cannot be varied or adjusted, because the different colors of light are emitted from equal areas of the materials of the stack units 2301, that is to say, the different colors of light are emitted from equal light emission areas. In this case, the colors of light emitted respectively from the stack units 2301 are in a ratio of red light, green light and blue light which is constant and not adjustable.

In FIG. 3, when the first and second voltages are applied, the first and second currents ($I_1$, $I_2$) flow between the first and second electrodes 21, 22 and pass through the optoelectronic stack 230. Under this condition, the overall current (i.e. the first and second currents ($I_1$, $I_2$)) is not distributed evenly in the optoelectronic stack 230 so that effective light emission areas of the light emitting stack units 2301 differ from each other, and the colors emitted respectively from the different stack units 2301 will have different light intensities. Since the intensities of red light, green light and blue light emitted from the optoelectronic stack 230 may be varied through a control of the difference in the current densities of the stack units 2301, the color of light emitted from the optoelectronic device may be adjusted.

For example, when the second voltage applying unit ($V_2$) applies a small second voltage between the driving electrode 25 and the first electrode 21, the current densities in the stack units 2301 differ from each other; but the magnitude of current density differences occurring in the stack units 2301 are small. In this case, the light emission areas that emit the red and green colors are medium size areas, and the light emission area that emits the blue color is a large size area so that the intensities of red and green colors of lights are lower than that of the blue color. When the second voltage applied between the driving electrode 25 and first electrode 21 becomes large, the magnitude of current density differences occurring in the stack units 2301 are large. In this case, the light emission areas that emit the red and green colors are small size areas, and the light emission area that emits the blue color is a large size area so that the intensities of the red and green colors of lights are much lower than that of the blue color.

It should be noted that the spatial arrangement of the first electrode 21, the second electrode 22 and the driving electrode 25 is not limited to a vertically or horizontally spaced apart orientation relative to each other, and the optoelectronic unit 23 may be formed in any shape or structural arrangement.

Figure 4:
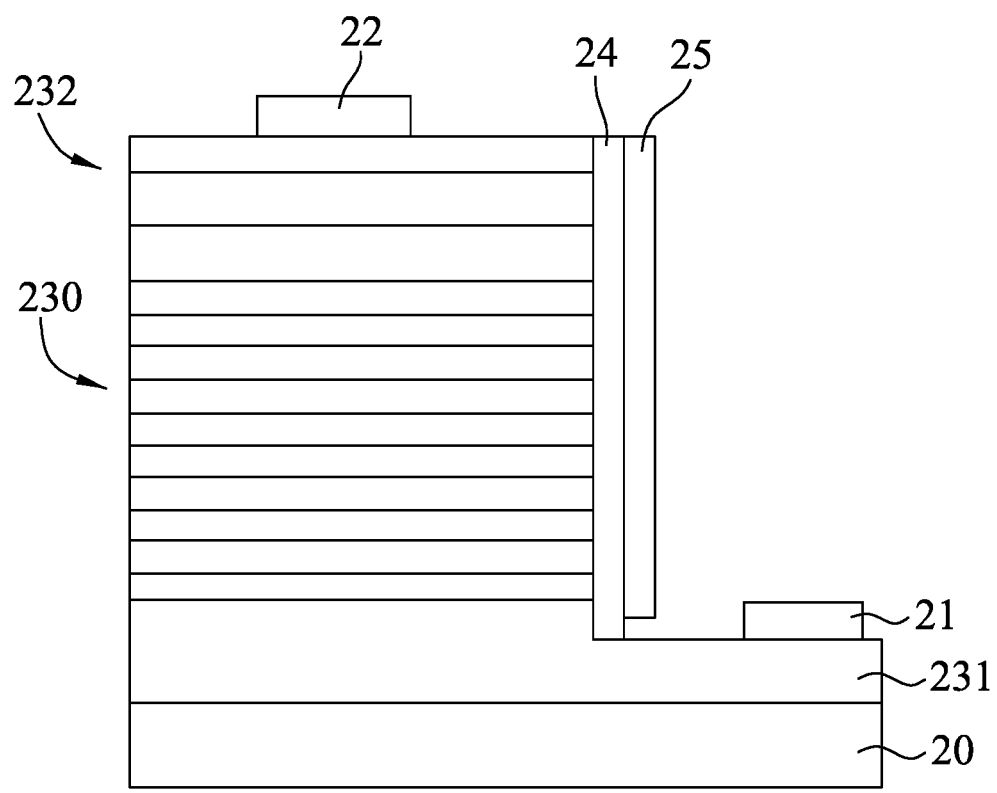
FIG. 4 is a cross-sectional view illustrating a first variation of the first embodiment.
Figure 5:
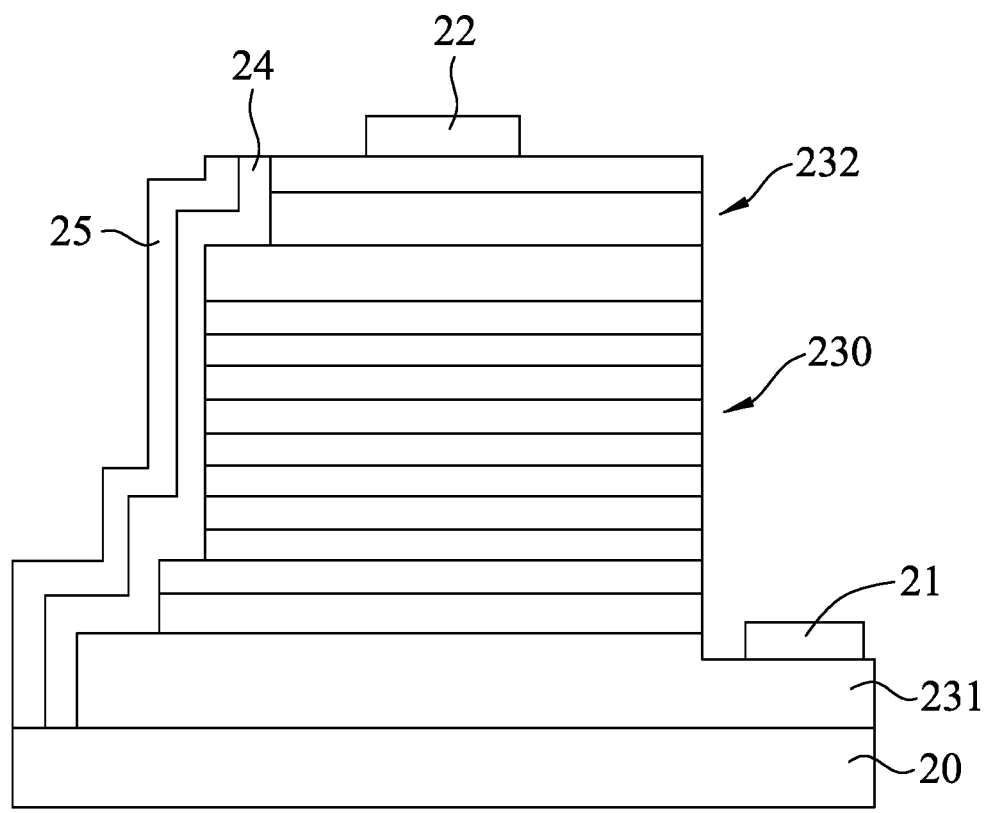
FIG. 5 is a cross-sectional view illustrating a second variation of the first embodiment.

Referring FIG. 4, which shows a first variation of the first embodiment, the insulating layer 24 along with the driving electrode 25 may be disposed on a lateral side of the optoelectronic stack 230 that is adjacent to the first electrode 21, and the driving electrode 25 is separated from the first electrode 21. Referring to FIG. 5, which shows a second variation of the first embodiment, the optoelectronic unit 23 has one lateral side in a stepped form, and the insulating layer 24 along with the driving electrode 25 are disposed on the lateral side of the optoelectronic unit 23. Alternatively, the optoelectronic unit 23 may have two lateral sides both in irregular forms.

Figure 6:
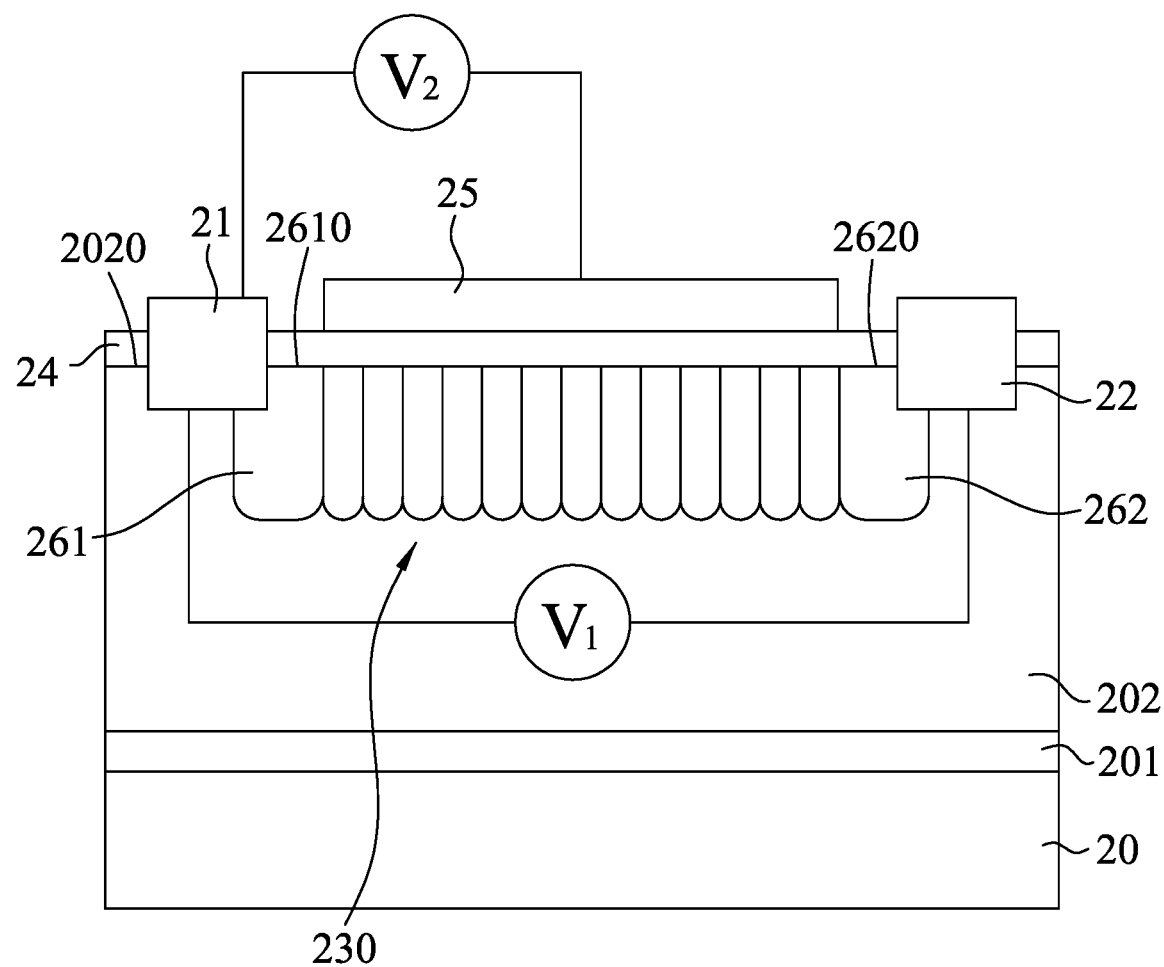
FIG. 6 is a cross-sectional view illustrating a second embodiment of an optoelectronic device according to the disclosure.

Referring to FIG. 6, a second embodiment of the optoelectronic device according to the disclosure includes the substrate 20, the first electrode 21, the second electrode 22, the optoelectronic unit 23, the insulating layer 24 and the driving electrode 25 as illustrated in the first embodiment, and further includes a buffer layer 201 that is disposed on top of the substrate 20.

In this embodiment, the optoelectronic unit 23 further includes an epitaxial layer 202, a first-type semiconductor layer 261 and a second-type semiconductor layer 262. The epitaxial layer 202 is disposed on top of the buffer layer 201 opposite to the substrate 20. The first-type and second-type semiconductor layers 261, 262 are formed in the epitaxial layer 202 in an embedded manner and spaced apart from each other in a direction transverse to a stacking direction of the epitaxial layer 202. The first-type and second-type semiconductor layers 261, 262 has outer surfaces 2610, 2620 exposed from a top surface 2020 of the epitaxial layer 202.

The optoelectronic stack 230 is disposed in the epitaxial layer 202 and is sandwiched between the first-type semiconductor layer 261 and the second-type semiconductor layer 262. The stacking direction of the first-type and second-type semiconductor layers 261, 262 and the optoelectronic stack 230 is transverse to the stacking direction of the epitaxial layer 202. The lateral side of the optoelectronic stack 230 is exposed from the top surface 2020 of the epitaxial layer 202. The insulating layer 24 covers the top surface 2020 of the epitaxial layer 202, the outer surfaces 2610, 2620 of the first-type semiconductor layer 261 and the second-type semiconductor layers 262, and the lateral side of the optoelectronic stack 230. The first electrode 21 and the second electrode 22 respectively contact the first-type and said second-type semiconductor layers 261, 262 at locations distal from the optoelectronic stack 230 and partially protruding outward from the epitaxial layer 202 through the insulating layer 24. In this embodiment, the first-type semiconductor layer 261 is an n-type semiconductor layer and the second-type semiconductor layer 262 is a p-type semiconductor layer.

Figure 7:
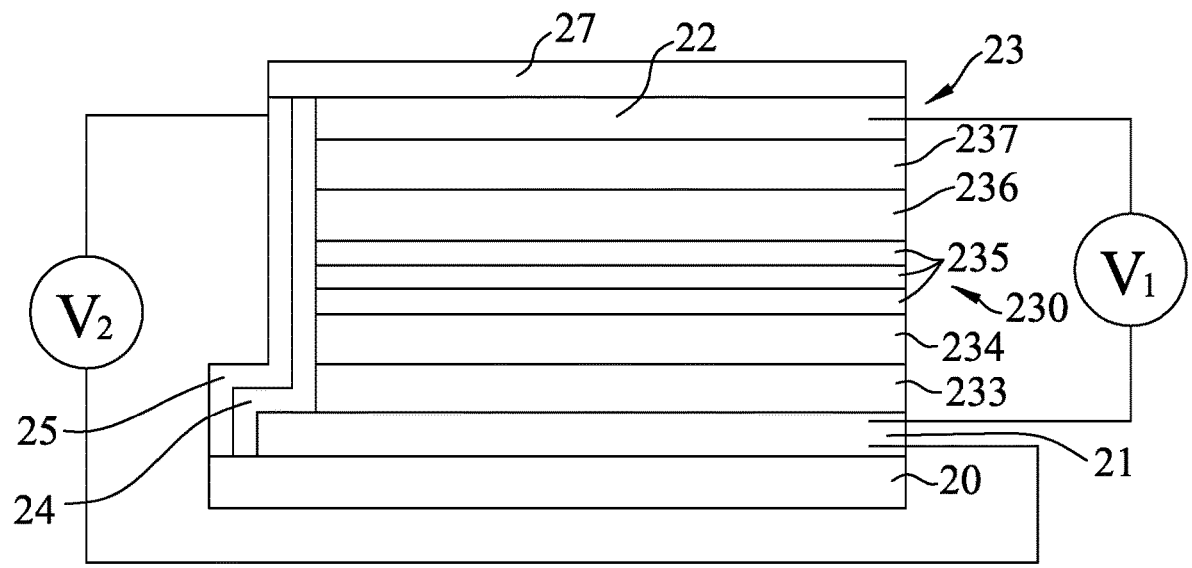
FIG. 7 is a cross-sectional view illustrating a third embodiment of an optoelectronic device according to the disclosure.

Referring to FIG. 7, a third embodiment of the optoelectronic device according to the disclosure is similar to the first embodiment, except that the third embodiment is an organic light emitting diode (OLED) device and the optoelectronic unit 23 has a different configuration.

In this embodiment, the optoelectronic device further includes a protective layer 27. The first electrode 21 is disposed on the substrate 20. The optoelectronic unit 23 further includes an electron injecting layer 233, an electron transferring layer 234, a plurality of light emitting layers 235, a hole transferring layer 236 and a hole injecting layer 237 disposed on the first electrode 21 opposite to the substrate 20 in such order. The second electrode 22 is disposed on the hole injecting layer 237 opposite to the hole transferring layer 236. The protective layer 27 is disposed on the second electrode 22 opposite to the hole injecting layer 237. The light emitting layers 235 form the optoelectronic stack 230. The insulating layer 24 and the driving electrode 25 are disposed in a same manner as in the first embodiment.

In this embodiment, the light emitting layers 235 emit different colors of light and have the same function as the light emitting layers 2301 in the first embodiment. It should be noted that the material used to form each layer of the optoelectronic device (i.e. OLED device) is well known by a person skilled in the art and thus is not illustrated herein.

The optoelectronic devices of the first, second and third embodiments, which are color adjustable light emitting devices, may be applied to a semiconductor material processing apparatus. In such application, the optoelectronic device may emit an adjustable color of light having a desired wavelength that may be absorbed by the material to be processed. For example, when the optoelectronic device is to be used for processing two different materials, such as silicon and gallium arsenide, it needs to emit two different wavelengths of light for the materials to absorb, respectively. For instance, under the same absorbing coefficient, silicon may absorb the light of 0.4 um wavelength whereas gallium arsenide may absorb the light of 0.6 um wavelength. Because the optoelectronic device can adjust the wavelength of light emitted therefrom so as to match with the wavelength to be absorbed by the material under processing, only one processing apparatus is necessary for processing one or more semiconductor materials. Thus, the optoelectronic device can solve the disadvantages of the prior art in which a single one processing apparatus can only be used for one wavelength of light, and two or more processing apparatuses are necessary to respectively process two or more semiconductor materials, thereby reducing the cost of fabrication and time.

Figure 8:
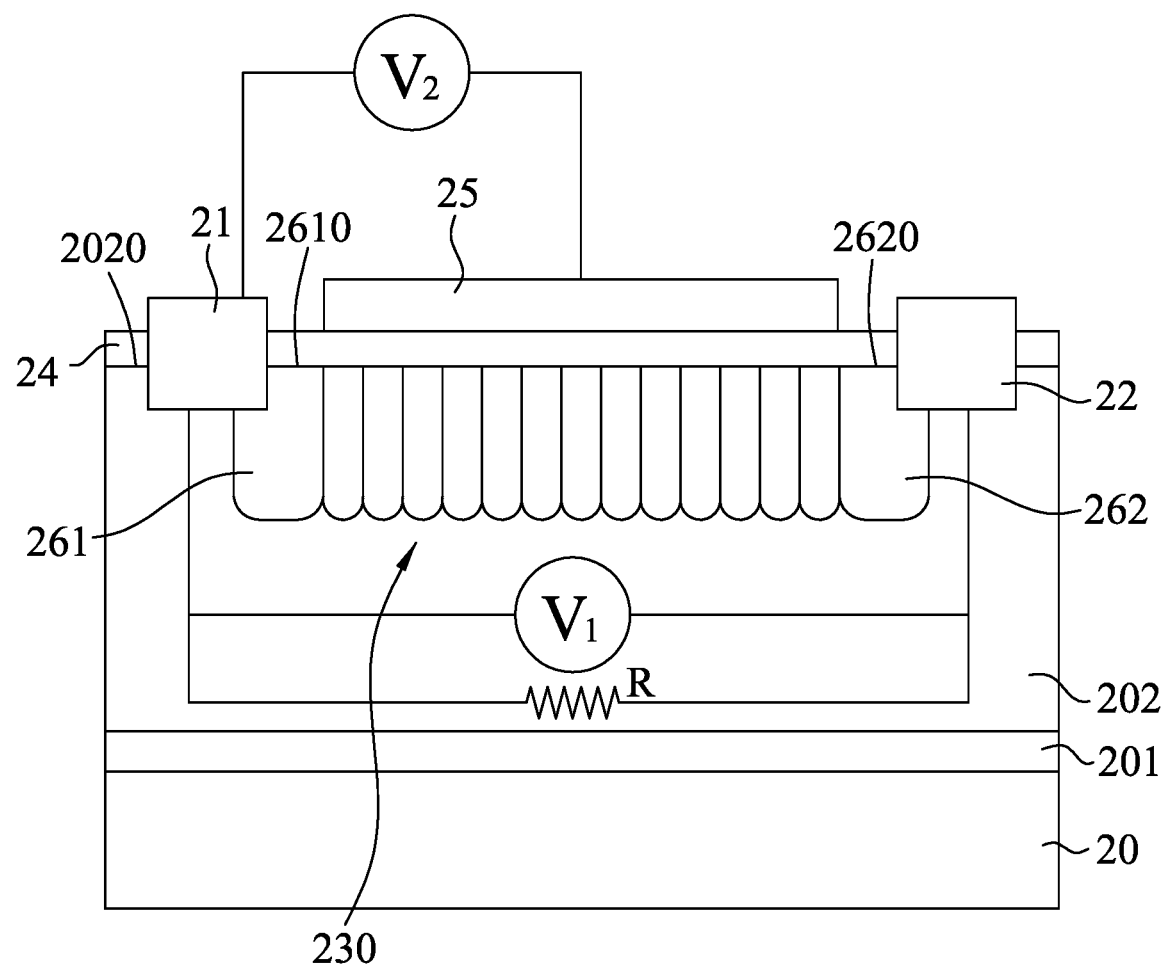
FIG. 8 is a cross-sectional view illustrating a fourth embodiment of an optoelectronic device according to the disclosure.

Referring to FIG. 8, a fourth embodiment of the disclosure which has a structure generally similar to that of the second embodiment. However, this embodiment is used as a solar cell which can absorb a wide range of wavelengths. The first electrode 21 is an anode and the second electrode 22 is a cathode, and the optoelectronic stack 230 absorbs different wavelengths of light, and generates and stores electrons and holes. By generating the first electric field between the first and second electrodes 21, 22 and generating the second electric field between the first electrode 21 and the driving electrode 25, the electrons and holes may be effectively separated and stored in the optoelectronic device. To be specific, the electrons and holes may be stored in an external load (i.e., a resistor (R)) that is connected between the first and second electrodes 21, 22 and is connected with the first voltage supplying unit ($V_1$) in parallel.

To sum up, when the optoelectronic device is used as a color adjustable light emitting device, the optoelectronic stack 230 emits multiple wavelengths of light, and the two voltage applying units ($V_1$, $V_2$) enable the optoelectronic device to adjust the current density difference occurring in the optoelectronic stack 230 and thereby adjust the ratio of lights having different wavelengths (i.e., the colors of light). When the optoelectronic device is used as a solar cell, the optoelectronic stack 230 absorbs multiple wavelengths of light. The first and second voltage applying units ($V_1$, $V_2$) enable the optoelectronic device to separate the generated electrons and holes more effectively and increase the conversion efficiency.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An optoelectronic device, comprising:
    a first electrode;
    a second electrode that is spaced apart from said first electrode;
    an optoelectronic unit that is disposed between said first electrode and said second electrode and includes an optoelectronic stack emitting or absorbing at least two wavelengths of light;
    an insulating layer that is disposed on a lateral side of said optoelectronic stack that extends in a stacking direction of said optoelectronic stack;
    a driving electrode that is disposed on said insulating layer at a location corresponding in position to said optoelectronic unit and that is separated from and without being in contact with said first electrode and said second electrode; and
    a first voltage applying unit that is adapted to apply a first voltage between said first electrode and said second electrode, and a second voltage applying unit that is adapted to apply a second voltage between said first electrode and said driving electrode, said first voltage producing a first current passing through said optoelectronic unit, said second voltage producing a second current that is different in flow direction from said first current.

2. The optoelectronic device as claimed in claim 1, wherein said second voltage applying unit is controllable to adjust a current density difference occurring in said optoelectronic stack and thereby adjust the wavelengths of light.

3. The optoelectronic device as claimed in claim 1, wherein said optoelectronic device is a color adjustable light emitting device, said first electrode functions as a cathode, and said second electrode functions as an anode.

4. The optoelectronic device as claimed in claim 1, further comprising a substrate, wherein said optoelectronic unit further includes a first-type epitaxial layer and a second-type epitaxial layer,
    wherein said optoelectronic stack is disposed between said first-type epitaxial layer and said second-type epitaxial layer,
    wherein said first-type epitaxial layer is disposed on said substrate, and
    wherein said first electrode is disposed on and contacts said first-type epitaxial layer, and said second electrode is disposed on and contacts said second-type epitaxial layer.

* * * * *